(12) United States Patent
Yasuda et al.

(10) Patent No.: US 6,259,300 B1
(45) Date of Patent: Jul. 10, 2001

(54) DIFFERENTIAL INPUT INTERFACE CIRCUIT AND METHOD FOR ADJUSTING DC LEVELS OF DIFFERENTIAL INPUT SIGNALS

(75) Inventors: Takeo Yasuda, Shiga-ken; Naohisa Hatani, Kyoto-fu, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/477,143

(22) Filed: Jan. 3, 2000

(30) Foreign Application Priority Data

Feb. 18, 1999 (JP) .................................................. 11-039392

(51) Int. Cl.[7] ....................................................... H03L 5/00
(52) U.S. Cl. .......................................... 327/333; 327/563
(58) Field of Search ..................................... 327/333, 560, 327/561, 562, 563; 330/177, 252, 259, 260, 261; 341/155, 158

(56) References Cited

U.S. PATENT DOCUMENTS

| 4,152,659 | * | 5/1979 | Gordon | 330/9 |
| 4,320,351 | * | 3/1982 | Brown, Jr. et al. | 330/260 |
| 5,170,081 | * | 12/1992 | Adachi et al. | 307/520 |
| 5,300,896 | * | 4/1994 | Suesserman | 330/260 |
| 6,100,759 | * | 8/2000 | Sirna et al. | 330/252 |

* cited by examiner

Primary Examiner—Jeffrey Zweizig
(74) Attorney, Agent, or Firm—H. Daniel Schnurmann

(57) ABSTRACT

A differential input interface circuit includes a reference level generation stage generating a DC level that coincides with the DC level within the system; capacitors for cutting-off the DC level of the differential input signals; resistors for matching the average of the non-inverting phase signal and the inverting phase signal of the differential input signals from which the DC levels have been cut-off on the output DC level generated by the reference level generation stage. Thus, a differential input interface circuit make it possible to match the DC level of differential inputs to the DC level within a system which is responsive to the differential inputs.

9 Claims, 6 Drawing Sheets

DIFFERENTIAL INPUT INTERFACE CIRCUIT AND METHOD FOR ADJUSTING DC LEVELS OF DIFFERENTIAL INPUT SIGNALS

FIELD OF THE INVENTION

The present invention is related to a differential input interface circuit and to a method for adjusting DC levels of differential input signals. More specifically, it relates to a differential input interface circuit that matches the DC levels of the differential input signals to the DC level of a system which is responsive to the differential inputs, and to the method for adjusting the DC level of the differential input signals.

BACKGROUND OF THE INVENTION

An A/D (analog-to-digital) converter 100 is shown in FIG. 5(a) as an example of a system responsive to differential inputs. The A/D converter 100 converts differential analog inputs, i.e., a non-inverting phase signal (IN(P)) and inverting phase signal (IN(N)) into a digital output signal (OUT). In such conversion of differential inputs, it is necessary to match the DC levels of the external analog input signals IN(P) and IN(N) (VDCP, VDCN) to the DC reference level (Vref) within the A/D converter 100.

FIG. 5(b) shows an example of prior circuits used for solving the problem of DC offset, wherein the conventional differential input interface circuit 102 consists of level shift circuits 104 and 1 14, and buffer circuits 106 and 116. The DC levels of the OUT (P) and OUT (N) (VDCP and VDCN) are adjusted by level shifting circuits 104 and 114 to match the DC level within the A/D converter 100, even if the DC levels of the external inputs IN(P) and IN(N) fluctuate. In the event wherein the analog input is part of a single line structure, the DC level of the input signal needs only to be shifted to the DC level (Vref) at which a correct A/D converter operation must operate. In the case where the analog input belongs to a differential line structure, the DC levels of the input signals are required to coincide to each other and, in addition, to the DC level (Vref) within the A/D converter 100. In other words, when there are differences between the DC levels of the analog inputs IN (P), IN (N) (VDCP, VDCN) and the DC level (Vref) within the A/D converter 100, as shown in FIG. 6(a), the DC level (VDCP) of the non-inverting phase signal OUT (P) is required not only to match the DC level (VDCN) of the inverting phase signal OUT (N), as shown in FIG. 6(b), but also to the DC level (Vref) within the A/D converter, as illustrated in FIG. 6(c).

FIG. 5(c) illustrates another type of conventional differential input interface circuit 112, consisting of capacitors 108 and 118. This input interface circuit 112 cuts-off the DC levels of the differential analog inputs IN (P) and IN (N) by way of AC coupling, using capacitors 108 and 118 for this purpose. The removal of the DC level eliminates the adverse effect of the DC offset (i.e., level fluctuation) both external to the A/D converter and from the interface. However, in this case, it is required to create an appropriate DC level within the input interface circuit 112 to ensure a correct operation of the A/D converter 100. This must be done simply and easily. In this manner, in order to eliminate the adverse effect of the offset from outside the A/D converter and the interface, it is required that the DC level of the external inputs match the correct operation level within the A/D converter.

OBJECTS AND SUMMARY OF THE INVENTION

Accordingly, it is an object of the invention to provide a differential input interface circuit which eliminates the problem of a DC offset between differential inputs without resorting to level-shifting, and to a method for adjusting the DC levels of the differential input signals.

It is another object of the invention to precisely match the DC level of the differential input signals to a reference DC level.

It is still another object to use the reference level Vref generated within the system as the DC level for the differential inputs, thereby eliminating the requirement for additional operations to process the DC levels per se originally contained in the differential inputs.

It is a further object of the present invention to simplify the design of differential input interface circuits while improving the reliability of matching the DC levels.

In accordance with a first aspect of the invention, the differential input interface circuit used within a system that is responsive to differential inputs includes a reference level generation stage for generating a DC level identical to the DC level within the system, and a DC level matching circuit for matching the DC levels of the differential input signals to the DC level of the reference level generation stage.

In a second aspect of the invention, there is provided a method for adjusting the DC levels of differential input signals which includes the steps of: cutting-off the DC component of the differential input signals, and superimposing the differential input signals from which the DC component was cut off, on the DC level prevalent throughout the system.

BRIEF DESCRIPTION OF THE DRAWINGS

The foregoing and other objects, aspects and advantages of the invention will be better understood from the following detailed description of a preferred embodiment of the invention when taken in conjunction with the accompanying drawings, in which.

DETAILED DESCRIPTION OF THE INVENTION

An embodiment of a differential input interface circuit and a method for adjusting the DC levels of differential input signals according to the invention will be described in detail with reference to the drawings, and more particularly with reference to FIGS. 1 and 4.

The differential input interface circuit of the present invention may be used preferentially for the input portion of a system which receives differential inputs, as for example, a channel VLSI (Very Large Scale Integrated Circuit) system for a disk drive for optical media, such as a DVD (Digital Video Disk), a CD (Compact Disk), an HDD (Hard Disk Drive), or a tape drive, and the like. Such VLSI system receives differential input signals obtained from a pick-up or a head through a pre-amplifier and performs an analog or digital signal processing. In this embodiment, an A/D converter will be described to illustrate such a signal processing system.

Figure 4:
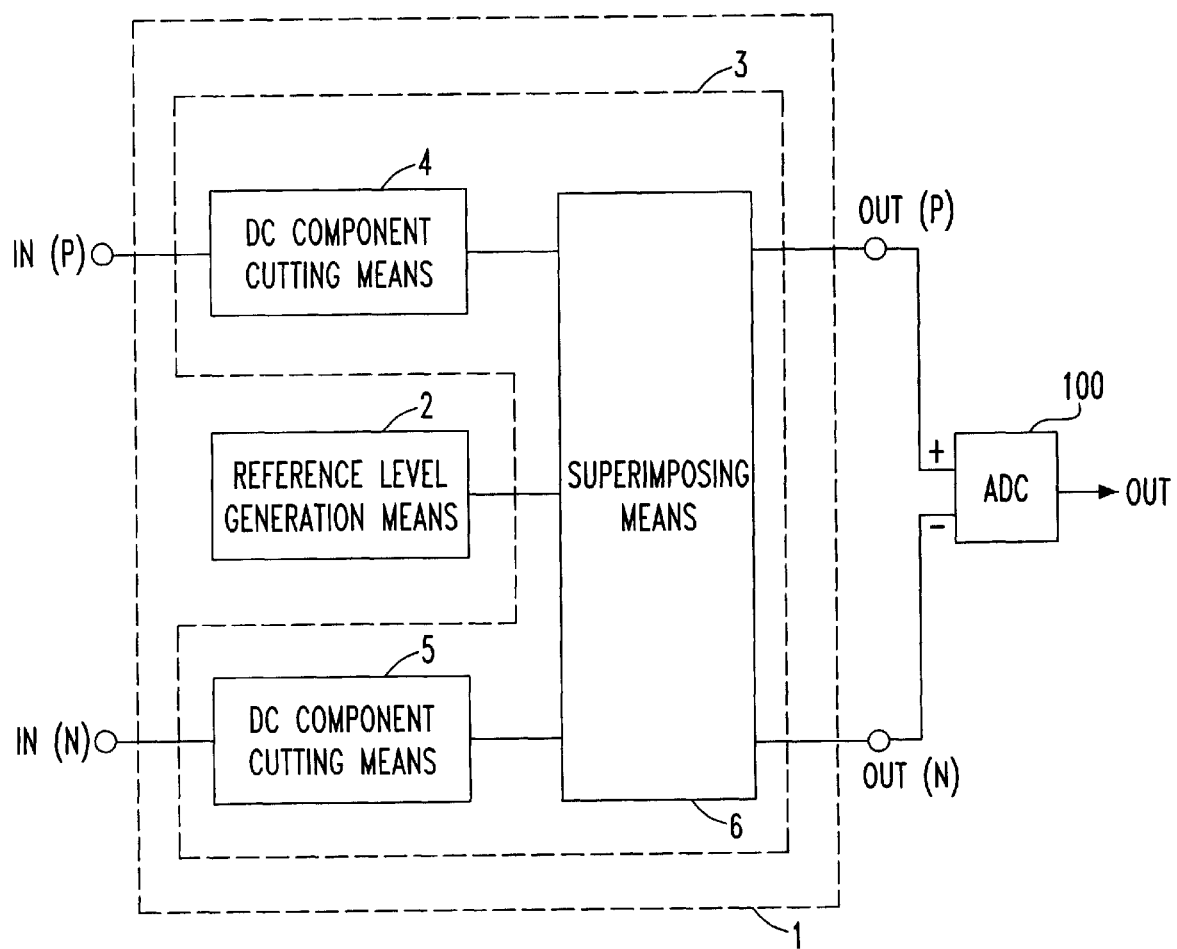
FIG. 4 is a circuit diagram showing a basic structure of the system including the differential input interface circuit, according to the present invention.
Figure 5A:
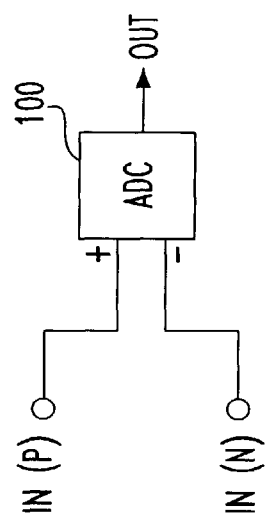
FIGS. 5a–5c are schematic diagrams showing three examples of prior art configurations for an A/D converter responsive to differential inputs.
Figure 5B:
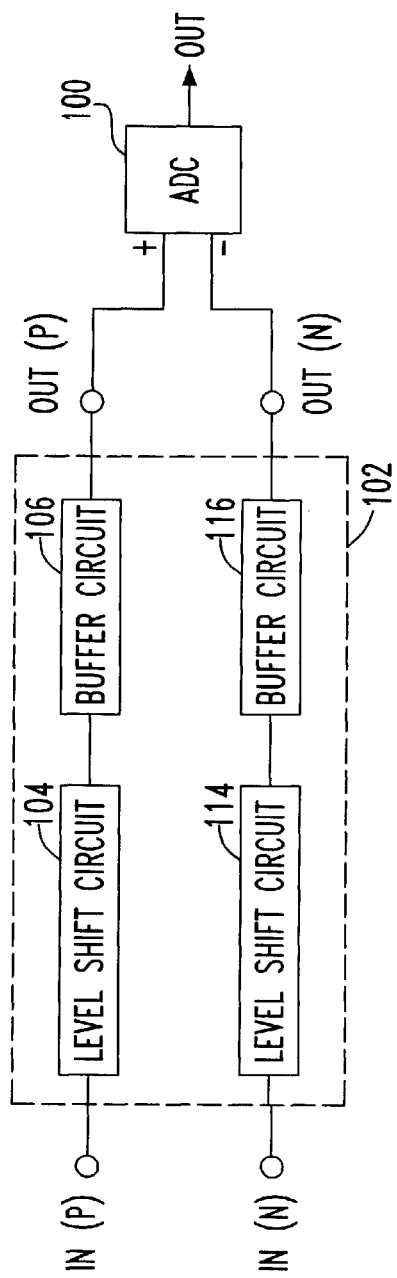
Figure 5C:
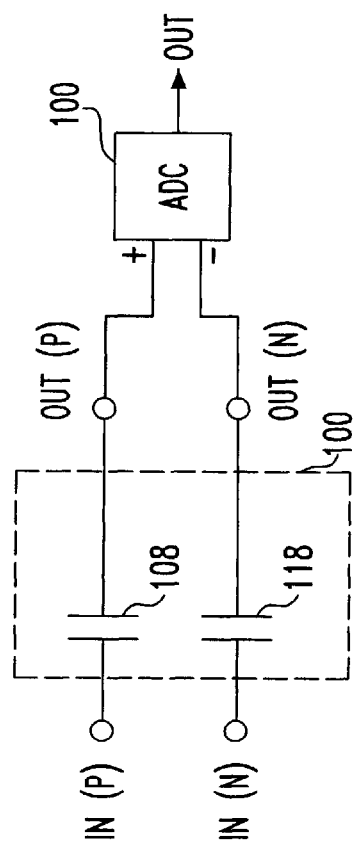
Figure 6A:
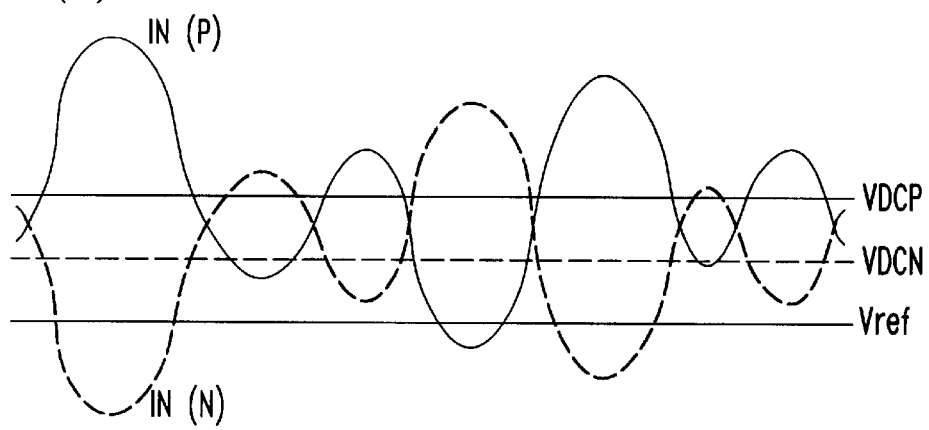
FIGS. 6a–6c are waveform charts showing three different states of the differential inputs.
Figure 6B:
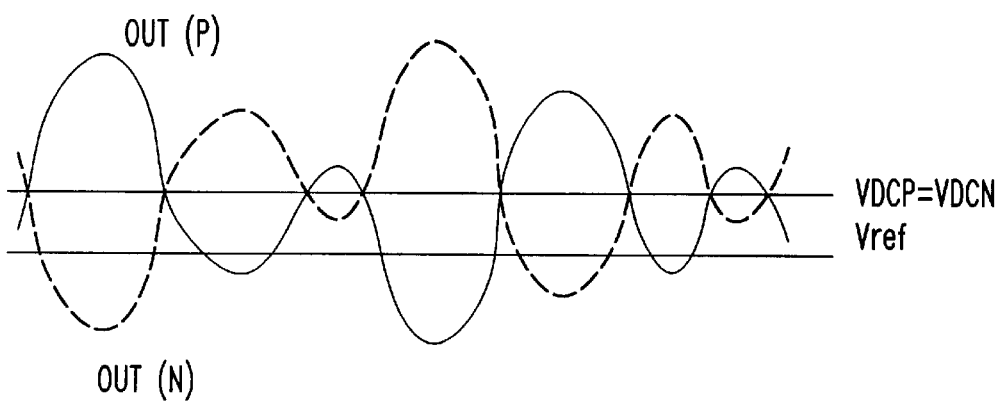
Figure 6C:
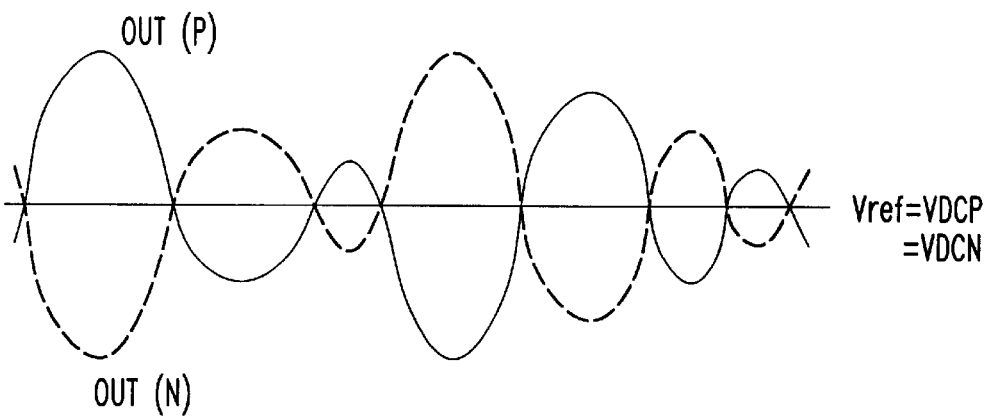

FIG. 4 is a block diagram showing the basic configuration of a differential input interface circuit 1 according to the present invention. An A/D converter 100 jointly with the differential input interface circuit 1 operates in response to a non-inverting phase signal IN(P) and to an inverting phase signal IN(N) of external differential analog input signals, converting the difference between the two inputs to a digital signal (OUT). The differential input interface circuit 1 includes a reference level generation stage 2 for generating a DC level equal to the DC level Vref generated within the A/D converter 100; a DC level matching stage 3 for matching the DC levels of the differential input signals IN(P) and IN (N) to the output DC level of the reference level generation stage 2. The DC level matching circuit 3 includes DC component cutting circuits 4 and 5 for cutting-off the DC component of differential input signals IN (P) and IN (N); and a superimposition circuit 6 for superimposing the differential input signals of which the DC component has been cut off, on the DC level of reference level generation circuit 2.

In the differential input interface circuit 1, the reference level generation block 2 generates a reference DC level Vref, the DC component cutting circuits 4 and 5 cutting-off the DC component of differential input signals IN (P) and IN (N), and the superimposition circuit 6 superimposes only the AC component of differential input signals IN (P) and IN (N) on the reference level Vref Thus, the DC levels of the differential input signals match the reference level Vref.

Figure 1:
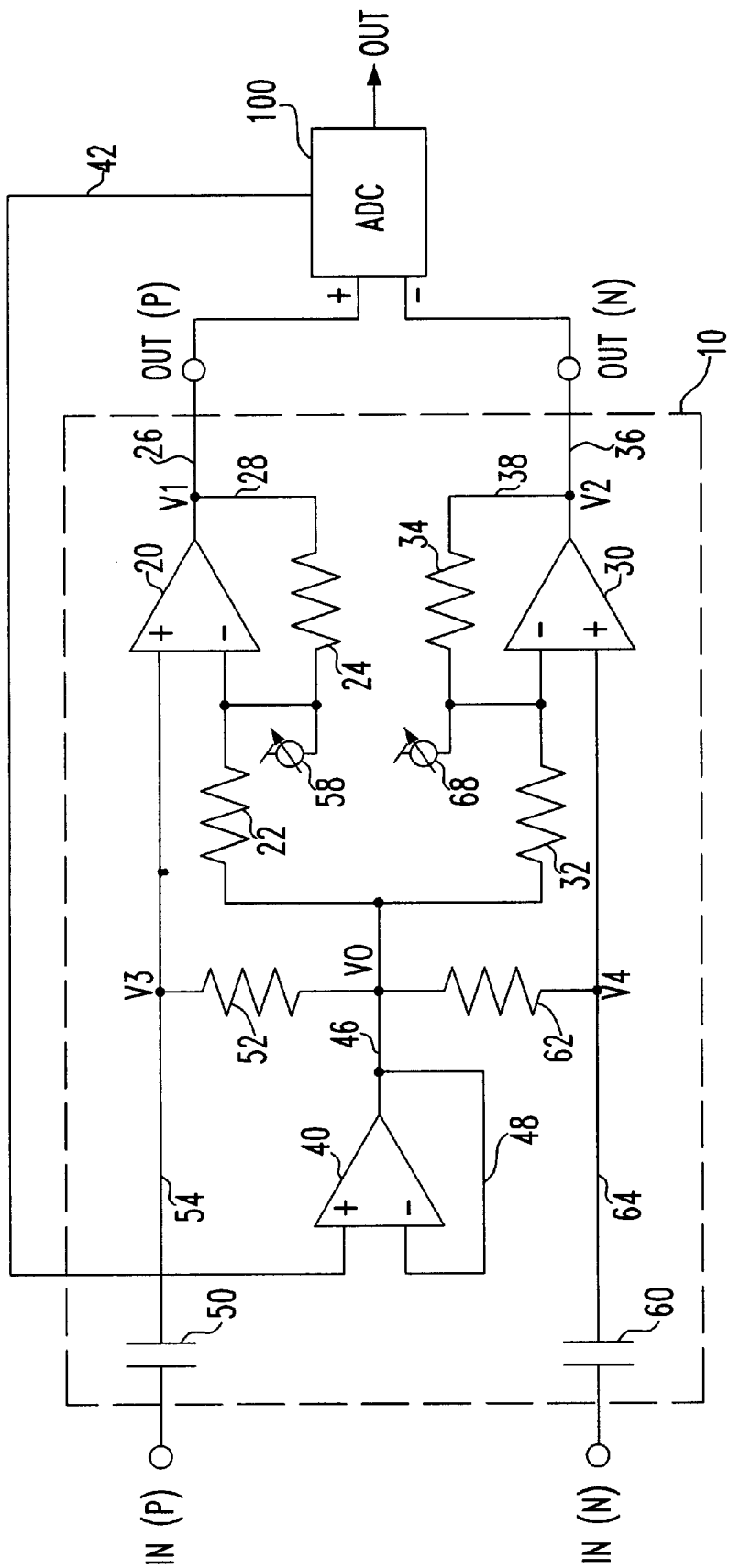
FIG. 1 is a circuit diagram showing a configuration of a system including the differential input interface circuit, according to the present invention.

FIG. 1 is a circuit diagram illustrating an embodiment of differential input interface circuit 10 along with the A/D converter 100 which is responsive to the differential inputs. The non-inverting phase signal IN (P) of the differential input signals is fed to a non-inverting phase signal line 54 through a capacitor 50. The inverting phase signal IN (N) of the differential input signals is fed to a signal line 64 through a capacitor 60. Capacitors 50 and 60 function as DC component cutting means for cutting-off the DC component of the inputted differential input signals IN (P) and IN (N). Accordingly, only the AC component of the input signals IN (P) and IN (N) are coupled to the signal lines 54 and 64, respectively. By removing the DC component, the adverse effect of the offset is thus prevented.

A DC level (referred to as reference level Vref) generated in the A/D converter 100 is connected to the non-inverting phase input of the operational amplifier 40 through a feedback line 42. Further, output of the operational amplifier 40 is connected to the inverting phase input of the operational amplifier 40 through a feedback line 48 while it is also used as a signal line 46. Accordingly, the reference level Vref is generated at the signal line 46 of the operational amplifier 40. That is, the operational amplifier 40 functions as a reference level generator for generating a DC level which coincides with the reference level Vref within the A/D converter 100. Moreover, the operational amplifier 40 also acts as a voltage follower buffer, which suppresses the fluctuations of the reference level Vref, thereby improving the driving capability of output line while buffering the reference level Vref.

Figure 2:
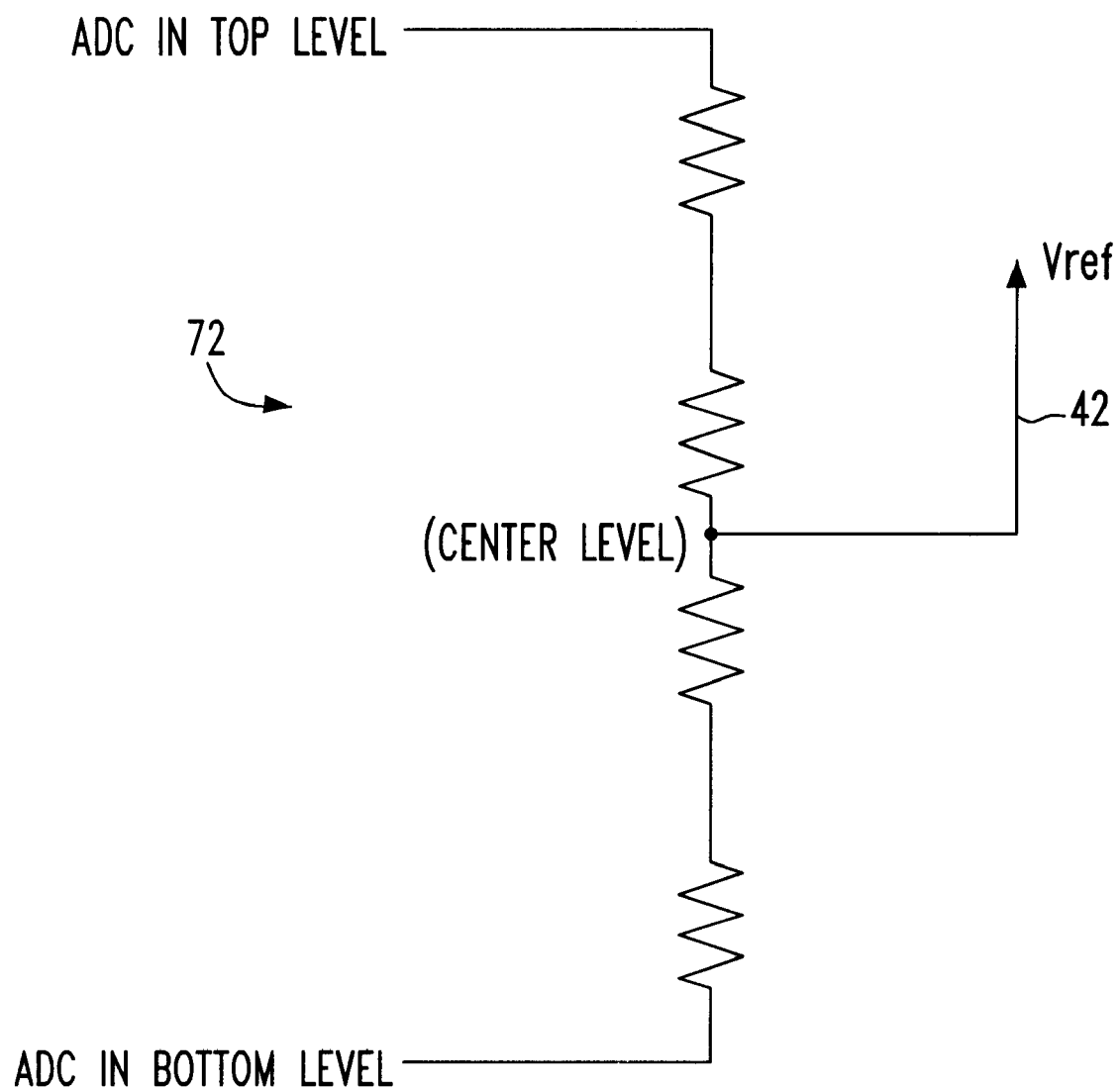
FIG. 2 is a circuit diagram showing an outline of a reference level generator provided in the AID converter shown in FIG. 1.

In this embodiment, the reference DC level Vref is obtained from a reference level generator within the A/D converter 100 which generates DC levels for the A/D converter 100. By way of example, in the case of a 'flash-type A/D converter', an equidistant voltage potential between comparison levels, i.e., top and bottom levels for A/D conversion is used as the reference level, as shown in FIG. 2. That is, the equidistant voltage potential of a resistor ladder 72 which determines the comparison levels is used as the reference level Vref output.

Signal line 54, to which the AC component of the non-inverting phase signal IN (P) is fed, is connected to signal line 46 of operational amplifier 40 through resistor 52. Signal line 64, to which the AC component of the inverting phase signal IN (N) is fed, is connected to signal line 46 through resistor 62. In this embodiment, resistance values R52 and R62 for the resistors 52 and 62 are set as follows:

$$R52=R62$$

In a quiescent state, when no AC component is fed to inputs IN (P) and IN (N), in terms of DC component, the capacitors 50 and 60 may be regarded as an open circuit, and the input impedance of operational amplifiers 20 and 30 described hereinafter, may be regarded as infinite. The signal lines 54 and 64 are connected to signal line 46 of the operational amplifier 40 through resistors 52 and 62, respectively. Accordingly, assuming that the voltage level of the signal line 46 is V0, the voltage level of the signal line 54 is V3, and the voltage level of the signal line 64 is V4, the relationship among V3, V4, and V0 being expressed by the following equation $$V3=V4=V0 \quad (1)$$

With this requirement, if two AC signals opposite in phase and equal in amplitude are fed to the inputs IN(P) and IN(N), then V3 and V4 will swing with the same amplitude but in opposite directions with respect to the middle point located at V0 level. A relationship among V3, V4, and V0 can be expressed by the following equation:

$$(V3+V4)/2=V0=V\text{ref} \quad (2)$$

Accordingly, since resistors 52 and 62 are identical to each other, the average of the signal levels V3 and V4 is equal to the reference level Vref. In other words, resistors 52 and 62 provide a way of matching the average of the non-inverting phase signal and the inverting phase signal of the differential input signals whose DC components was cut off, to the DC level of the reference level generator 40.

Figure 3A:
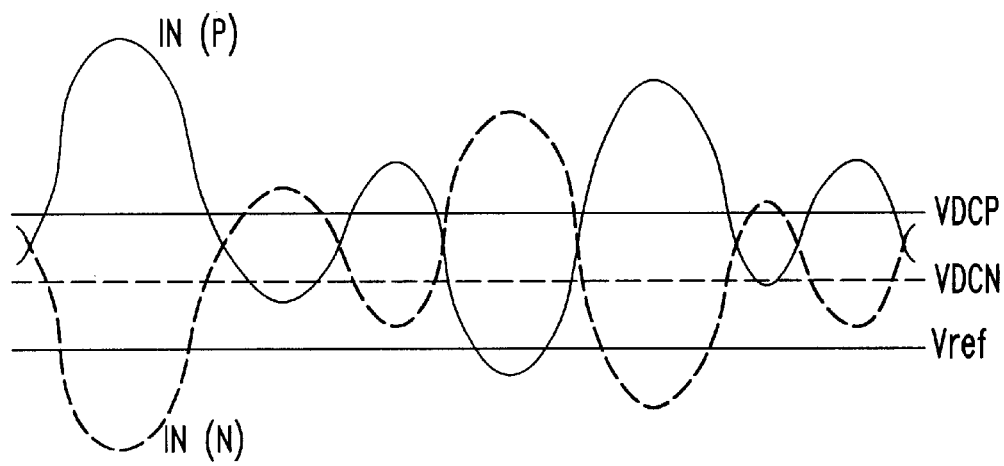
FIG. 3 is a waveform chart showing an outline of the DC level adjustment by the differential input interface circuit in FIG. 1.
Figure 3B:
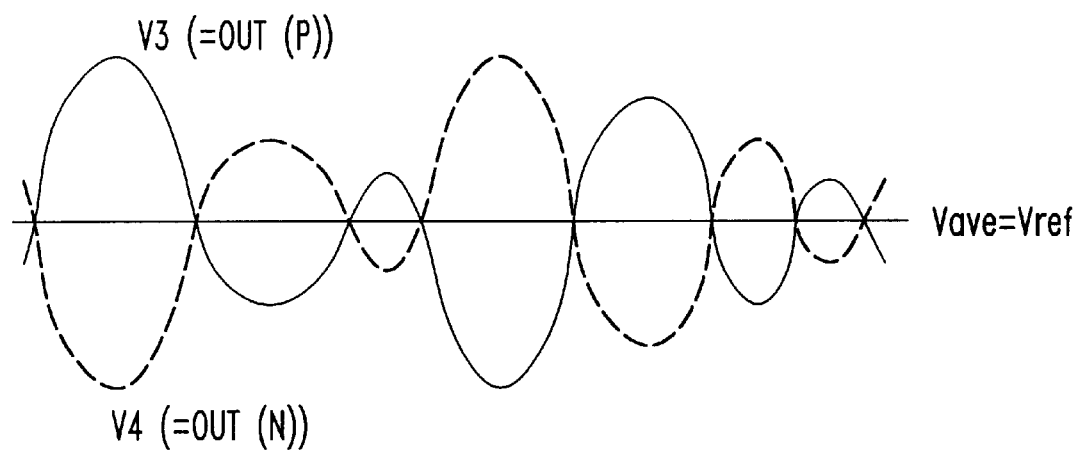

Accordingly, assuming that the DC levels (VDCP, VDCN) of the differential input signals IN (P) and IN (N) deviate from the reference level Vref, as shown in FIG. 3(a), the DC levels (VDCP, VDCN) are cut-off by capacitors 50 and 60. In the case where the DC levels are cut-off, the average voltage level (Vave) of the AC components (V3, V4) of the non-inverting phase input signal IN (P) and the inverting phase signal IN (N) is equal to the reference level Vref, as shown in FIG. 3(b). In this manner, since the DC component of external inputs IN (P) and IN (N) is cut-off by capacitors 50 and 60, respectively, the effect of DC fluctuations can be eliminated. Further, the DC level within the interface circuit 10 is matched to the middle voltage potential (reference level Vref) of the comparison levels used in the A/D converter 100 by operational amplifier 40. That is, the DC level of the AC coupled inputs IN (P) and IN (N) are matched to the reference level Vref within the A/D converter 100.

The signal line 54 is connected to the non-inverting phase input of the operational amplifier 20. The signal line 64 is attached to the non-inverting phase input of the operational amplifier 30. Further, the output line 46 of the operational amplifier 40 is connected to the inverting phase input of the operational amplifier 20 through resistor 22 and to the inverting phase input of the operational amplifier 30 through resistor 32. The output of operational amplifier 20 is fed back to the inverting input of the operational amplifier 20 through feedback line 28 and resistor 24. The output of the amplifier 20 is also connected to the non-inverting input of A/D converter 100 through signal line 26. Assuming that the voltage level of the non-inverting input to the amplifier 20 is V3, the voltage level of the operational amplifier 40 is V0, the voltage level of the operational amplifier 20 is V1, and the resistance values of resistors 22 and 24 are R22 and R24, respectively. The relationship among V1, V3 and V0 can be expressed by the following equation:

$$V1 = (R24/R22 + 1)V3 - (R24/R22)V0 \quad (3)$$

The output of the operational amplifier 30 is fed back to the inverting input of the operational amplifier 30 through feedback line 38 and resistor 34. The output of amplifier 30 is connected to the inverting input of the A/D converter 100 through signal line 36. Assuming that the voltage level of the non-inverting input of the operational amplifier 30 is V4, the voltage level of the operational amplifier 40 is V0, the voltage level of the operational amplifier 30 is V2, and the resistance values of the resistors 32 and 34 are R32 and R34, respectively. The relationship between V2, V4, and V0 can be expressed as follows:

$$V2 = (R34/R32 + 1)V4 - (R34/R32)V0 \quad (4)$$

In the manner shown by equations (3) and (4), the amplification gain and offset of the operational amplifiers 20 and 30 can be adjusted by resistors 22 and 24 and by resistors 32 and 34, respectively. In this embodiment, resistors R22, R24, R32, and R34 are set as follows:

$$R24 = R34$$

and $$R22 = R32,$$

wherein, preferably, R24<<R22 and R34<<R32. Since R22>>R24, equation (3) can be expressed as follows:

$$V1 \approx V3$$

(Approximately=)
Since R32>>R34, equation (4) can be expressed as follows:

$$V2 \approx V4$$

In this instance, the differential output signals OUT (P) and OUT (N) to be applied to the A/D converter 100 correspond to the differential input signals (V3, V4) with their DC levels being matched to the reference level Vref, as shown in FIG. 3(b).

A variable current source 58 is connected to the inverting input of the operational amplifier 20, and a variable current source 68 is connected to the inverting input of the operational amplifier 30. The offset of the operational amplifier 20 can be adjusted by the variable current source 58 and the offset of the operational amplifier 30 can be adjusted by the variable current source 68. In other words, the variable current sources function as a DC level adjusting means for canceling the deviation of the DC level caused in the interface circuit. Adding such operational amplifiers 20 and 30 is likely to increase the driving capability of the differential signals which are applied to the A/D converter 100. Further, by using the variable current sources 58 and 68, the DC levels of the non-inverting phase output OUT (P) (=V1) and the inverting phase output OUT (N) (=V2) can be adjusted independently. In this manner, the target DC level Vref is generated within the interface circuit 10 in response to the reference level in the A/D converter 100, while the DC levels of differential inputs IN (P) and IN (N) are matched to the DC level Vref by superimposing only the AC component in the differential inputs IN (P) and IN (N) on the DC level Vref. Thus, there is no need for further DC level adjustments, such as level shifting. Therefore, the present invention can facilitate circuit design and reduce the turnaround-time.

While a particular embodiment of the present invention has been described, operational amplifiers of two-stage structure or cascode-type, and the like, can be used interchangeably as operational amplifiers 20, 30, and 40. The operational amplifiers 20 and 30 should be selected considering the frequency of the AC component of the input signal. For the operational amplifier 40, a low-speed operational amplifier can be advantageously used because the reference level Vref contains only a DC component. Preferably, the operational amplifier 40 should have a small output resistance and a large driving capability to safeguard the voltage stability of the reference level Vref output. Due to the extremely large input impedance of the operational amplifiers 20 and 30, as viewed from the external inputs IN (P) and IN (N), the capacitor 50 and resistor 52, and capacitor 60 and resistor 62 act as high pass filters. For this reason, the values of capacitors 50 and 60 and resistors 52 and 62 are required to be set so that the cutoff frequency Fc of these filters can be lower than the minimum frequency of the input signals IN (P) and IN (N). In other words, the cutoff frequency is set such that the AC component of the inputs IN (P) and IN (N) can pass with a certain margin. The cutoff frequency Fc can be expressed with the following equation $$Fc = 1/2\pi RC$$

wherein R is the resistance of resistor 52, and C is the capacitance of capacitor 50, or R is a resistance of resistor 62, and C is the capacitance of capacitor 60.

While the present invention has been shown and described with respect to an illustrative and preferred embodiment, it will be understood that various modifications may be made. For example, the present invention will be used when the DC level of input signal to a single input system or multiple input system with three or more inputs is converted to a predetermined internal DC level. In addition, the present invention is not limited to the use for interfacing, but can also be used for in-circuit level conversion. Such changes, modifications, variations and other uses which do not depart from the spirit or scope of the present invention are deemed to be covered by the invention.

What is claimed is:

1. A differential input interface circuit within a system responsive to differential inputs and providing differential outputs comprising:
    a reference level generation means responsive to a first DC level from said system for generating a second DC level which coincides with said first DC level from said system; and
    a DC level matching means for matching said first DC level of said differential input signals to said second DC level generated by said reference level generation means.

2. The differential input interface circuit according to claim 1, wherein said DC level matching means further comprises means for cutting-off the DC level of the differential input signals; and means for superimposing the differential input signals from which the DC level was cut off, on the DC level generated by said reference level generation means.

3. The differential input interface circuit according to claim 2, wherein said superimposing means further comprises an average matching means for matching the average of a non-inverting phase signal and an inverting phase signal of the differential input signals from which the DC level was cut-off, on the DC level generated by said reference level generation means.

4. The differential input interface circuit according to claim 3, wherein said average matching means further comprising two identical resistors, one of said resistors being connected between a signal line receiving said non-inverting phase signal and an output line of said reference level generation means, and the other of said resistors being connected between the signal line receiving said inverting phase signal and the output line of said reference level generation means.

5. The differential input interface circuit according to claim 1, further comprising a DC level adjusting means for adjusting the DC levels of the differential input signals to be outputted to said system.

6. A method for matching DC levels of differential input signals to a DC level within a system which is responsive to differential inputs, comprising the steps of:

cutting-off the DC level of the differential input signals; and superimposing differential inputs signals from which the DC level has been cut off on the DC level within the system, wherein superimposing the differential inputs signals further comprises matching the average between a non-inverting phase signal and an inverting phase signal of the differential input signals from which the DC level was cut-off on the DC level within the system.

7. A method for generating within a system a differential input interface circuit responsive to differential input signals and providing differential outputs comprising the steps of:

providing a reference level generation means responsive to a first DC level from said system for generating a second DC level which coincides with said first DC level from said system; and matching said first DC level of said differential input signals to said second DC level generated by said reference level generation means.

8. The method according to claim 7, wherein said step of matching the DC levels further comprises the steps of cutting-off the DC level of the differential input signals, and superimposing the differential input signals from which the DC level was cut off on the DC level that was generated.

9. The method according to claim 8, wherein said step of superimposing the differential input signals further comprises the steps of matching the average between a non-inverting phase signal and an inverting phase signal of the differential inputs from which the DC level was cut-off on the DC level that was generated.

* * * * *